United States Patent [19]

Tsang et al.

[11] Patent Number: 5,262,279
[45] Date of Patent: Nov. 16, 1993

[54] DRY PROCESS FOR STRIPPING PHOTORESIST FROM A POLYIMIDE SURFACE

[75] Inventors: Chi-Hwa Tsang, Aloha; Peter K. Charvat, Portland; Robert M. Guptill, Beaverton, all of Oreg.

[73] Assignee: Intel Corporation, Santa Clara, Calif.

[21] Appl. No.: 942,322

[22] Filed: Sep. 9, 1992

Related U.S. Application Data

[63] Continuation of Ser. No. 632,183, Dec. 21, 1990, abandoned.

[51] Int. Cl.$^5$ .................................................. G03C 5/00
[52] U.S. Cl. ...................................... 430/311; 430/323; 430/329; 430/330; 156/626; 156/646; 156/659.1
[58] Field of Search .................. 430/30, 256, 258, 311, 430/313, 317, 323, 325, 327, 329, 330, 331

[56] References Cited

U.S. PATENT DOCUMENTS 4,201,579  5/1980  Robinson et al. .................... 430/329

FOREIGN PATENT DOCUMENTS

| | | | |
|---|---|---|---|
| 57-035323 | 2/1982 | Japan | 430/329 |
| 59-41835 | 3/1984 | Japan | 430/329 |
| 1-211922 | 8/1989 | Japan | 430/329 |

Primary Examiner—Marion E. McCamish
Assistant Examiner—Kathleen Duda
Attorney, Agent, or Firm—Blakely, Sokoloff, Taylor & Zafman

[57] ABSTRACT

A dry process for stripping photoresist from a polyimide surface formed on a substrate is described. The present invention is practiced after a polyimide layer has been etched. Prior to etching, the polyimide surface is masked with photoresist which is then patterned. The polyimide is etched in exposed regions, for example to form vias to expose contacts located beneath the polyimide layer. The present invention then strips the photoresist in a single wafer downstream plasma etcher in a plasma comprising oxygen radicals. The polyimide is subjected to a short preheat before introduction of the oxygen plasma, and is also heated during the stripping process. The strip proceeds until an endpoint is detected. The endpoint is detected by a change in the spectral emission of the plasma which occurs due to a decrease in the amount of $CH_3$ radicals present in the system when the polyimide surface is reached. A short timed over-etch is then employed to ensure complete removal of the photoresist. The stripping process of the present invention selectively strips photoresist compared to polyimide, so that exposed portions of the polyimide surface are not significantly etched during the timed overetch.

12 Claims, 5 Drawing Sheets

DRY PROCESS FOR STRIPPING PHOTORESIST FROM A POLYIMIDE SURFACE

This is a continuation of application Ser. No. 07/632,183, filed Dec. 21, 1990, now abandoned.

BACKGROUND OF THE INVENTION

Polyimide (PI) has a variety of uses in the semiconductor industry. It can be used in place of a conventional silicon dioxide ($SiO_2$) or silicon nitride ($Si_3N_4$) layer as an interlayer dielectric. In this case it serves as an insulative layer to prevent shorting between features or devices formed from a first conductive layer and features or devices formed from a subsequent conductive layer.

Polyimide can also be used as a passivation layer or protective overcoat. When used as a passivation layer its purpose is to protect the integrated circuit from scratches and other physical defects. That is, it is used as a protective coating to improve yield and reliability. For a discussion of the uses and advantages of polyimide see "Polyimide Coatings for Microelectronic Applications," Y. K. Lee and J. D. Craig, *Polymer Materials for Electronic Applications*, American Chemical Society, page 107 and "Polyimides for Use as VLSI Multilevel Interconnection Dielectric and Passivation Layer," Thomas E. Wade, *Microscience, Polyimides for VLSI Dielectric and Passivation Layer*, page 61.

In the semiconductor industry, polyimide is normally spun on the wafer. A pool of liquid polyimide is poured on the substrate and the substrate is spun at high speeds, typically about 3,000 rpm, to create a polyimide layer of uniform thickness across the surface of the substrate. The polyimide is next partially cured or imidized. In most applications the polyimide must then be patterned. Normally a photoresist layer is applied next and is spun on in a process similar to the spinning of the polyimide. Next the photoresist is exposed to light to define the regions which will be developed away. If a positive photoresist is used the regions exposed to light will dissolve in the developer leaving the desired pattern. If a negative photoresist is used the regions not exposed to light will be dissolved in developer.

After the pattern has been defined by the photoresist as described above the polyimide is etched. In the case of positive photoresist the developer used for the photoresist also etches polyimide, thus the developing of the photoresist and the etching of the polyimide are carried out in one step. When negative photoresist is used, sodium hydroxide, potassium hydroxide or tetra alkyl ammonium hydroxide can be used as an etchant for the polyimide. Additionally the polyimide can be dry etched in a plasma etch using an oxygen gas. If this method is used the photoresist thickness normally must be greater than that of the polyimide since in most processes they etch at the same rate as one another in a plasma etch.

After etching of the polyimide in the processes described above the photoresist must be removed or stripped. Generally the photoresist is approximately the same thickness as when spun on, that is, the photoresist developing and polyimide etching processes do not significantly reduce the thickness of the photoresist layer.

The stripping of the photoresist is normally carried out in a wet process with the solvents N-butyl acetate (NBA) and isopropanol (IPA). As an example of a wet process to strip photoresist, the wafers are sequentially dipped in two NBA baths at room temperature for 10 minutes in each. They are next dipped in an IPA bath at room room temperature for 10 minutes. After the NBA and IPA dips, the wafers may be rinsed in water and then spun dry.

There are several disadvantages to the wet photoresist stripping method described above. The process is not cost effective. Both NBA and IPA evaporate quickly at room temperature resulting in a high consumption rate of the chemicals. In addition the process is labor intensive with low throughput and many processing steps.

The wet stripping method also has safety and environmental problems. Because of the frequent handling required in the process, operators are frequently exposed to solvent vapor. In addition the high consumption rates of these chemicals is an environmental hazard.

The wet stripping method also suffers from poor process control. It can leave residual photoresist on the polyimide surface and requires a short plasma clean afterwards. In addition the polyimide layer itself is sometimes lifted up from the surface it has been applied to during the course of the photoresist stripping by the solvents used in the wet method.

Because of these disadvantages of the wet stripping method, it is preferred to strip the photoresist in a dry process whenever possible. Most commonly an oxygen plasma is used and the process is called plasma etching or ashing. In these processes an oxygen plasma comprising oxygen radicals is formed. The oxygen reacts with the photoresist to form water and various other compounds thereby stripping the photoresist layer. For example, when stripping photoresist off of a silicon dioxide ($SiO_2$) surface, there is extremely good selectivity. That is, the oxygen plasma will etch photoresist without etching the $SiO_2$. Therefore, a batch of substrates can be placed in an oxygen plasma for a timed period. The time period usually includes an over-etch to ensure complete removal of the photoresist. Since the selectivity in etching photoresist is good, there is no need to determine precisely when the underlying $SiO_2$ surface has been reached and it is not detrimental to over-etch to the extent necessary to overcome non-uniformities in the photoresist thickness or non-uniformities in the etching process.

However, plasma etch has not been used for removing photoresist from polyimide due to the fact that both are similar organic materials and in most processes it is found that they etch at about the same rate. Additionally, it is thought that because of the similarities in their chemical make-ups there is no way to reliably detect an endpoint of the photoresist stripping. Because of these factors, it is possible to etch away much of the patterned polyimide layer in a timed dry photoresist stripping process.

What is needed therefore is a dry process for stripping photoresist from a polyimide surface with good photoresist to polyimide selectivity where the endpoint of the photoresist stripping can be reliably determined and the strip can be stopped after complete removal of the photoresist but before significant amounts of polyimide have been etched.

SUMMARY OF THE INVENTION

The present invention describes a process for using a plasma etch process for stripping photoresist from a polyimide surface. The present invention can be utilized in the manufacture of numerous semiconductor devices which utilize polyimide as an interlayer dielectric, a passivation layer, or for other applications.

Prior art methods are utilized to coat the wafer with polyimide. Next, conventional techniques are used to apply a coating of photoresist which is then masked and patterned. The polyimide exposed by the photoresist pattern is then etched. In the case of a positive photoresist the patterning of the photoresist and the etching of the underlying polyimide occur in the same step. After the polyimide has been etched, the photoresist used as a mask is removed by the process of the present invention.

The present invention is practiced in a single wafer down stream plasma etch system with endpoint detection. The substrates with the photoresist to be removed are placed in the system. The system is then pumped down. After pump down, the substrates are subjected to a short preheat by infrared lamps. After the preheat, oxygen plasma is introduced into the chamber to strip the photoresist. During the stripping, the substrates continue to be heated by infrared radiation. Once an endpoint is detected, indicating that the photoresist has been stripped and the polyimide layer is reached, a short, timed over-etch is employed to ensure complete removal of the photoresist. In the present invention the photoresist strips at a rate four times that of the polyimide. Thus, insignificant etching of the polyimide occurs during the overetch.

In the present invention a process is described for removing a layer of photoresist from a polyimide surface in a dry, plasma process. An endpoint is detected when the etch has proceeded to remove all the photoresist from the polyimide surface and thereafter a short timed over-etch is employed. Because the photoresist etches at a much quicker rate than the polyimide, insignificant etching of the polyimide layer occurs during the photoresist stripping process.

DETAILED DESCRIPTION OF THE PRESENT INVENTION

The present invention describes a dry plasma process for stripping a layer of photoresist from a polyimide surface. In the following description, numerous specific details are set forth such as specific thickness, etc., in order to provide a thorough understanding of the present invention. It will be obvious, however, to one skilled in the art, that the present invention may be practiced without these specific details. In other instances, well known process steps have not been described in detail in order not to obscure unnecessarily the present invention.

Figure 1:
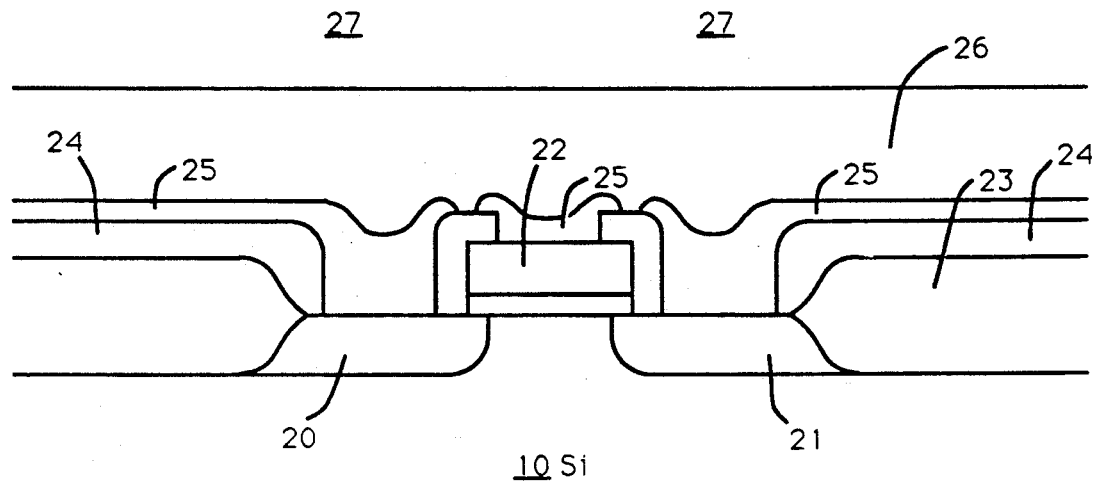
FIG. 1 is a cross-sectional elevation view of a prior art semiconductor device with a polyimide layer formed thereon.

Referring to FIG. 1, a typical semiconductor device on which the present invention can be practiced is shown. Shown in FIG. 1 is source 20, drain 21, MOS gate 22, field oxide 23, first oxide 24 and first metal 25. In the device shown, the gate 22 as well as source 20 and drain 21 may, optionally, have a silicide formed thereon.

In FIG. 1 layer 26 is the polyimide layer that will be used as an interlayer dielectric. In the presently preferred embodiment polyimide layer 26 is made from a polyimide from the PYRALIN TM line of polyimides manufactured by DuPont. Conventionally, polyimide layer 26 is formed as follows. A pool of liquid polyimide is poured on the substrate and the substrate is spun at high speeds, typically about 3,000 rpm. This spinning will produce a uniform layer of uncured polyimide across the surface of the wafer. The thickness of the uncured layer will depend upon the viscosity of the polyimide, the spin speed used, and other factors. The uncured polyimide layer is next partially cured before application of a photoresist layer, which is to be used as a mask. This partial curing partially imidizes the polyimide layer. This is performed, for example, by baking in a convection oven at approximately 120 degrees C. for approximately 30 minutes. Other prior art curing methods, such as hot plate heating, may be employed in place of convection oven curing. The curing of the polyimide results in polyimide layer 26 shown in FIG. 1. The thickness of polyimide layer 26 is slightly less than that of the uncured polyimide layer immediately after it is spun on. The thickness of polyimide layer 26 is in the range of approximately 1-3 microns. Regions 27 of FIG. 1 show where it is necessary to make a via or opening in polyimide layer 26 in order to make contact to first metal 25 above source 20 and drain 21.

Although a particular MOS device has been shown it will be appreciated that the present invention can be practiced on any semiconductor device. In addition, although an interlayer dielectric polyimide layer 26 is shown it will be appreciated that the present invention can be practiced whenever it is necessary to remove photoresist from a polyimide layer, for example where the polyimide layer is used as a passivation layer. When used as a passivation layer, the polyimide will conventionally be applied as above, but to thickness in the range of approximately 2-8 microns. The thickness of the photoresist layer to be removed from a polyimide passivation layer will normally be in the range of 1-3 microns.

Figure 2:
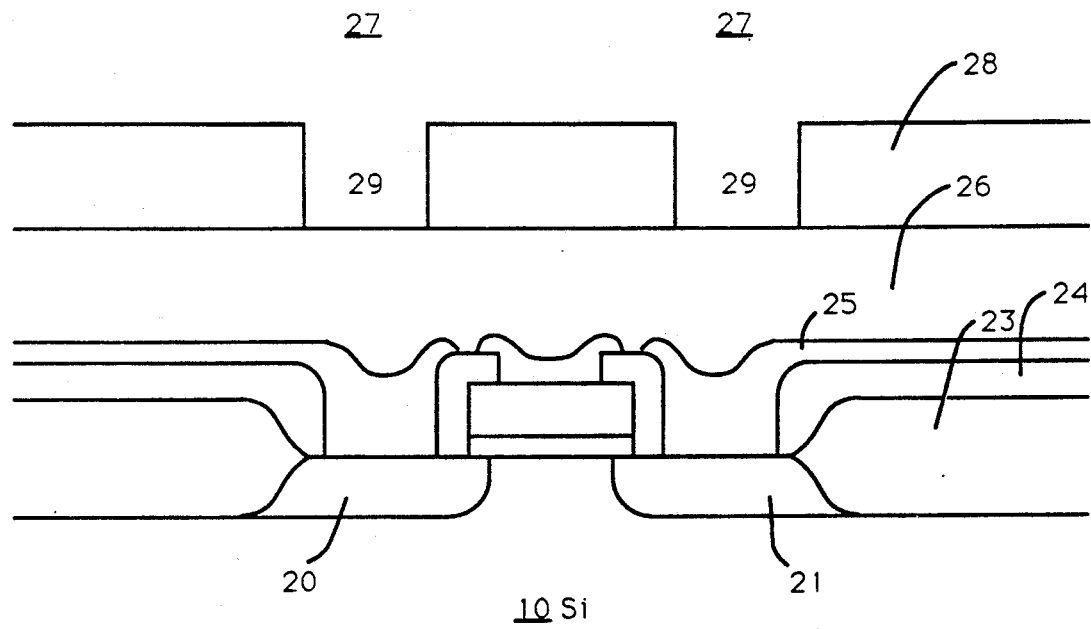
FIG. 2 is a cross-sectional elevation view of the semiconductor body of FIG. 1 with a patterned photoresist layer thereon.

FIG. 2 shows the structure of FIG. 1 after a photoresist layer 28 has been spun on the substrate and patterned. The thickness of photoresist layer 28 is in the range of 2-6 microns. The photoresist is patterned such that there are openings 29 in the regions 27 where it is necessary to make vias through the polyimide layer 26. The coating and patterning of photoresist layer 28 is accomplished by well known prior art techniques. In addition, photoresist layer 28 can be either positive or negative photoresist. In the case of positive photoresist the formation of the openings 29 in photoresist layer 28 in region 27 will be accomplished at the same time as the etching of the polyimide, described below in conjunction with FIG. 3.

After openings 29 have been made in photoresist layer 28 in regions 27, the polyimide will be etched. As mentioned, in the case of positive photoresist the developers used to form the openings 29 in photoresist layer 28 will also etch polyimide layer 26 in the regions 27. If a negative photoresist is used an etchant such as sodium hydroxide or potassium hydroxide can be used to etch the polyimide layer 26 in the regions 27.

Figure 3:
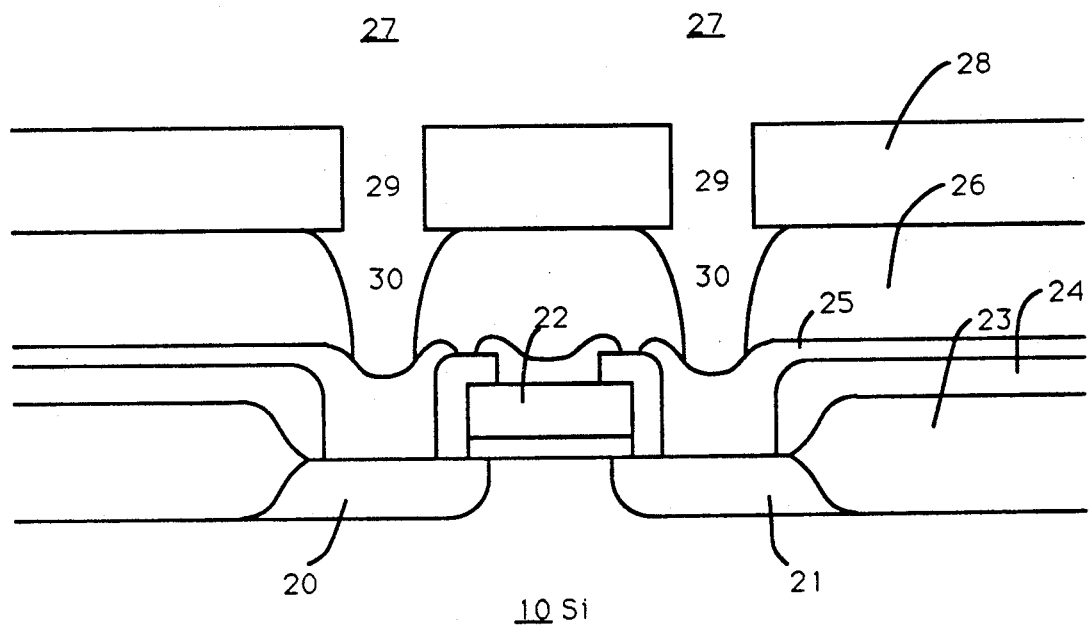
FIG. 3 is the semiconductor body of FIG. 2 after etching of the polyimide layer.

FIG. 3 shows the semiconductor structure of FIG. 2 after the etch of the polyimide layer is complete. Vias 30 have been formed in polyimide layer 26 in the regions 27 extending to first metal 25 above the source 20 and drain 21. In addition, there will be many such vias in addition to those shown in the Figures through polyimide layer 26 extending to device areas on substrate 10. The above described processes of coating the substrate with polyimide and with photoresist as well as patterning the photoresist and etching the polyimide layer, are performed by well known prior art techniques.

Figure 4:
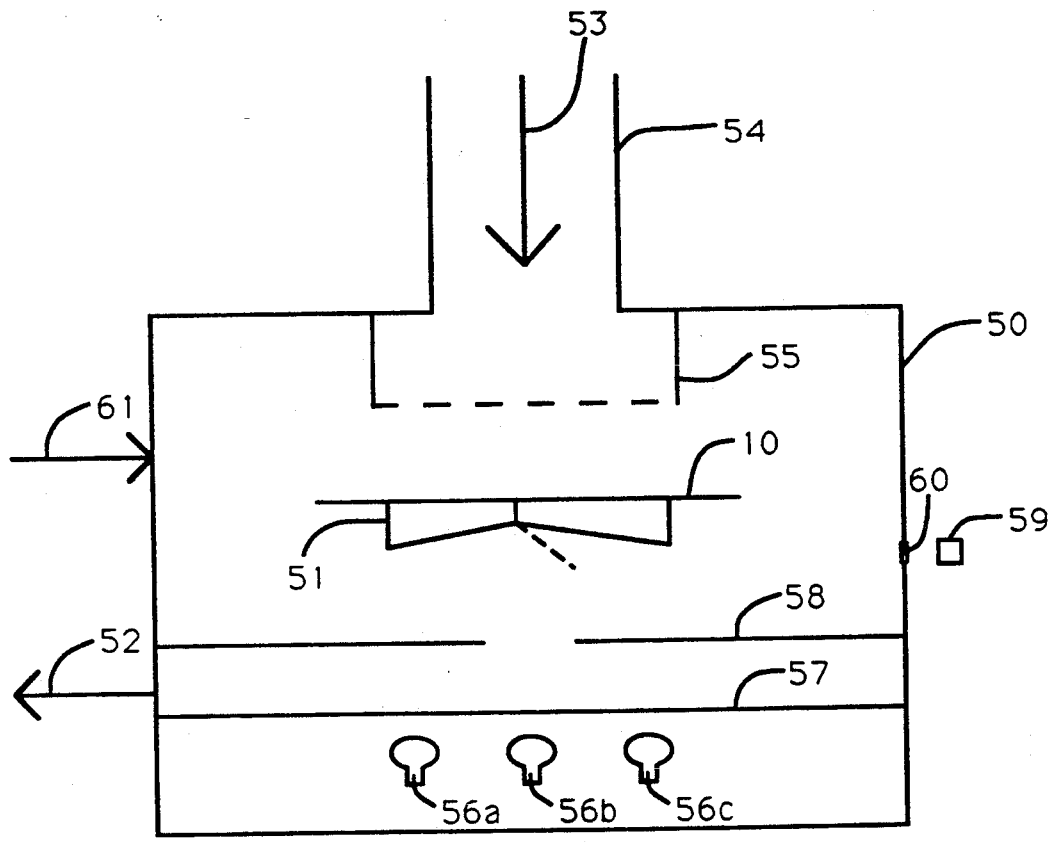
FIG. 4 is a cross-sectional schematic view of the plasma etch chamber where the present invention is practiced.

FIG. 4 shows a schematic representation of the plasma etch system 50 where the present invention is practiced. Plasma etch system 50 is a single wafer microwave downstream plasma etch system with endpoint detection capability. Plasma etch system 50 may be, for example, a GaSonics Aura System. The semiconductor substrate 10 is placed on substrate holder 51. Substrate holder 51 has 3 prongs or "fingers" which hold the substrate 10. These fingers hold the substrate securely but are very thin, so that they do not block a significant amount of infrared radiation from heat lamps 56 described below. The system is pumped down through vacuum line 52 to create a partial vacuum. The pressure in system 50 after pump down (base pressure) is in the range of approximately 10–30 millitor in the presently preferred embodiment. After pumping the system down and pre-heating the substrate 10 (as will be described below), a steady supply of oxygen plasma, indicated by arrow 53, is introduced into the system 50 during the stripping process. The vacuum is pulled continuously through line 52 during the stripping process. In the currently preferred embodiment, the pressure of system 50 is maintained in the range of 1.5–3.0 torr during the stripping process.

Oxygen plasma 53 is provided by supplying diatomic oxygen ($O_2$) to plasma tube 54. Plasma tube 54 generates the oxygen plasma by utilizing a magnetron to supply microwave energy to the diatomic oxygen which breaks up the oxygen-oxygen bond of the $O_2$ molecule to create single oxygen atoms ($O^*$) which are called oxygen radicals. That is, oxygen plasma 53 comprises oxygen radicals (which are shown by arrows 35 of FIG. 5 below). It is the oxygen radicals which perform the stripping of the photoresist layer 28.

Infrared (IR) heat lamps 56 are used to heat the substrates. In the currently preferred embodiment, the lamps used have a power output in the range of 500–1000 watts. In the currently preferred embodiment the lamps shown as 56a and 56c of FIG. 4 are operated at 1000 W and lamp 56b is operated at 500 W. The infrared radiation from lamps 56 is transmitted through quartz window 57 and quartz orifice plate 58. In the currently preferred embodiment, the substrate is pre-heated before the introduction of oxygen plasma 53 by turning on the two outer lamps (lamps 56a and 56c) immediately after the system 50 has been pumped down to the desired pressure range. This preheat is carried out for approximately 10 seconds in the currently preferred embodiment. After the preheat, the outer lamps are turned off, the center lamp (lamp 56b of FIG. 4) is turned on and the plasma is introduced into the chamber to start the stripping process. In the currently preferred embodiment, it is believed that the substrate reaches temperatures in the range of approximately 200°–400° C. The heating sequence is designed to further cure or imidize the polyimide layer 26. The effect of the heating is described below in conjunction with FIG. 5. Although specific wattages and a specific sequence of lamps and pre-heat time is given for the currently preferred embodiment, it will be obvious to one skilled in the art that the lamps used, wattages and time of pre-heat can be varied while still achieving the object of the invention. Additionally, it is possible to practice the invention with no pre-heat, lamps 56 being used only during the stripping operation. Also, it is believed that the invention may be practiced with other forms of heating, such as conduction. For example, in place of substrate holder 51 of system 50, a heated plate may be used to perform the heating of substrate 10 performed by lamps 56 in the currently preferred embodiment.

Figure 5:
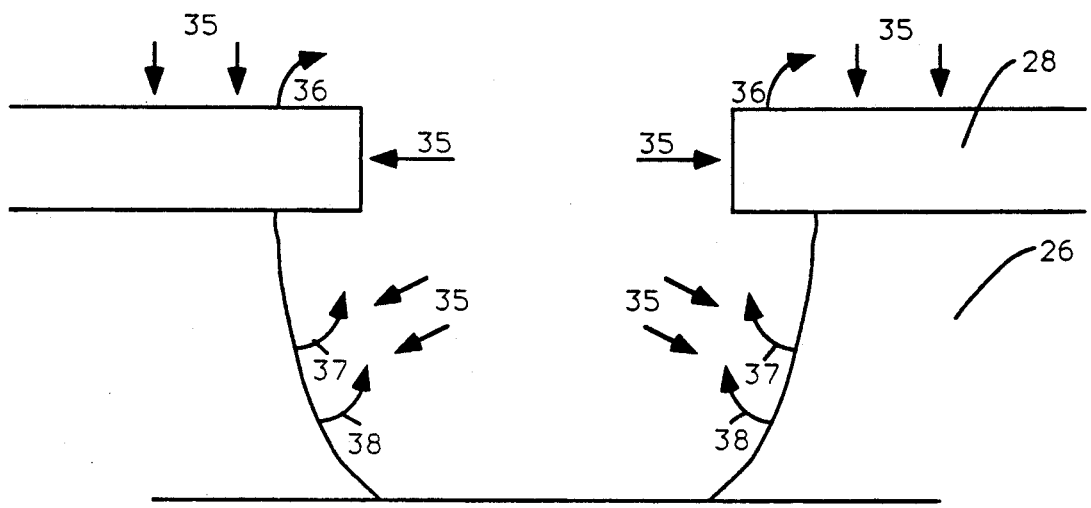
FIG. 5 is a cross-sectional elevation view of the etching process.

FIG. 5 shows a close-up view of photoresist layer 28 and polyimide layer 26 in region 27 during the stripping process. Activated oxygen radicals 35 react with all surfaces of the photoresist layer 28 as well as the exposed regions (sidewalls) of polyimide layer 26. Reaction products 36 are formed from the reaction of the O radicals 35 with photoresist layer 28. Reaction products 36 include water ($H_2O$), carbon dioxide ($CO_2$), carbon monoxide (CO) and methyl radicals ($CH_3^*$) as well as other carbon and hydrocarbon compounds. Similarly, reaction products 37 are formed from the reaction of oxygen radicals 35 with polyimide layer 26. Reaction products 37 will include $H_2O$, $CO_2$, CO, $CH_3^*$, and in general be very similar to reaction products 36. Reaction products 37 however, will have a significantly lower concentration of $CH_3^*$ than reaction products 36.

As discussed in conjunction with FIG. 4, IR lamps 56 heat substrate 10 and partially cures polyimide layer 26. This heating during the stripping process is believed to contribute in several important ways to the selectivity of the present invention. First, it causes $H_2O$ in addition to that contained in reaction products 37 to be released from the polyimide. The $H_2O$ liberated during the stripping and heating process dilutes the concentration of oxygen radicals near the surface of polyimide layer 26. Second, during this partial curing, solvent 38 is released. In most commercially available polyimides, such as Dupont's PYRALIN TM line of polyimide, the solvent includes N-methyl-2-pyrrolidone (NMP). The solvent 38 reacts with oxygen radicals 35 at or near the surface of polyimide layer 26. These first two effects cause there to be fewer oxygen radicals 35 to etch the exposed regions (sidewalls) of polyimide layer 26 as compared with the oxygen radicals 35 available to etch the surface of photoresist layer 28. Finally, as the polyimide surface becomes partially cured or imidized, it etches at a slower rate. These three effects, that is, the presence of solvent near the polyimide surface, the presence of a greater amount of $H_2O$ near the polyimide surface than near the photoresist surface, and the imidization of the polyimide, cause the exposed regions of polyimide layer 26 to etch at a much slower rate than the exposed regions of photoresist layer 28. Therefore, the vias 30 formed in polyimide layer 26 in the above processing are not significantly widened during the photoresist stripping process. Similarly, features other than vias 30, whether formed in a polyimide layer used as a passivation layer, interlayer dielectric or other application, are not significantly widened or distorted during this stripping process.

Reaction products 36 and reaction products 37 both include $CH_3^*$ radicals. However, as stated above, reaction products 36 include a significantly higher concentration of $CH_3^*$ radicals than reaction products 37. Thus, when the stripping is complete, that is when photoresist layer 28 has been removed, the concentration of $CH_3^*$ radicals in the chamber drops significantly.

Returning to FIG. 4, endpoint detector 59 adjacent to quartz window 60 monitors the light intensity at the frequency associated with $CH_3^*$ returning to its ground state. During the stripping of photoresist, this intensity stays at one level due to the relatively constant concentration of $CH_3^*$ radicals formed by the reaction of oxygen radicals 35 with photoresist layer 28. After stripping of photoresist layer 28 is complete, the concentration of $CH_3^*$ radicals drops off as described above. There is thus a corresponding decrease in the light intensity monitored by endpoint detector 59. This drop in intensity indicates the completion of photoresist stripping and beginning of polyimide stripping and therefore is used to detect the endpoint of the photoresist stripping.

The use of the endpoint detector 59 to monitor the light intensity associated with the energy released by $CH_3^*$ radicals returning to ground state has provided a precise, reliable and reproducible method of detecting the completion of the stripping of photoresist layer 28.

After the endpoint is reached, there may be a thin layer of residual photoresist on some areas of polyimide layer 26. Therefore, a short, timed overetch is employed to ensure complete removal of photoresist layer 28. As discussed above, several factors are believed to cause the plasma to selectively strip the photoresist. In practice, a stripping ratio of photoresist to polyimide of 4:1 has been achieved, that is, in the present invention photoresist is stripped at a rate four times that of polyimide. Therefore, the timed over-etch to ensure complete removal of photoresist layer 28 will cause only minimal etching of polyimide layer 26. In the currently preferred embodiment, it takes approximately 15 seconds to reach the endpoint. Also in the currently preferred embodiment, an overetch of 35 seconds is employed. After the overetch, the system 50 is purged with nitrogen ($N_2$) through line 61 to bring the system 50 to atmospheric pressure, and substrate 10 is removed.

Figure 6:
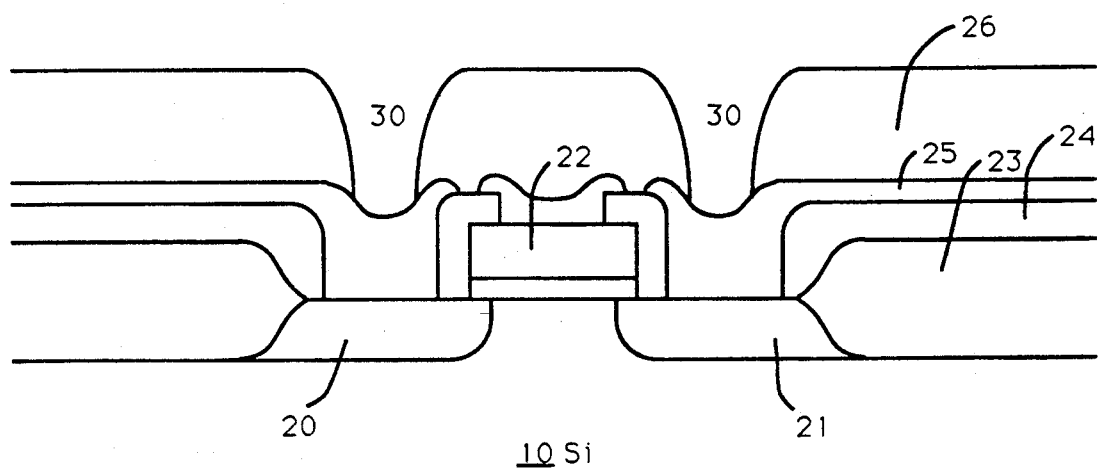
FIG. 6 is a cross-sectional elevation view of the semiconductor body of FIG. 3 after the photoresist has been removed.

FIG. 6 shows the semiconductor device of FIG. 3 after complete removal of photoresist layer 28. The device now has polyimide layer 26 as a interlayer dielectric, vias 30 in polyimide layer 26 to make contact to active areas and no trace of photoresist on polyimide layer 26. As can be seen from the figure, polyimide layer 26 has not been significantly reduced in thickness from the stripping of photoresist layer 28, and vias 30 have not been significantly widened or distorted by the stripping process. Typically, following the above described processing, a second metal will be deposited to contact first metal 26 in the regions exposed by vias 30.

It is anticipated by using the endpoint detection and substrate heating described above, the present invention can be practiced by conventional plasma etch systems by designing the process chemistry and operating parameters to achieve a satisfactory stripping rate and good selectivity of photoresist to polyimide. The process chemistry can be one of the conventional gas mixtures of oxygen and sulfur hexafluoride ($SF_6$), carbon tetrafluoride ($CF_4$), nitrous oxide ($N_2O$), nitrogen trifluoride ($NF_3$) (sometimes referred to as ammonia fluoride) or nitrogen ($N_2$) used to etch photoresist off of non-organic surfaces such as silicon dioxide ($SiO_2$). The system 50 used in the practice of the currently preferred embodiment of the present invention has the advantages of a fast resist strip rate, and lower cost than conventional plasma etching systems.

Thus, a cost effective, safe and reliable method for stripping photoresist from a polyimide surface is described. The present invention utilizes a one step dry process eliminating the safety and environmental hazards associated with the prior art wet processes. In addition, the process costs are lower due to the decreased use of consumable chemicals and the elimination of complex processing steps. Yield loss due to undercutting caused by the prior art wet chemicals is also eliminated. The stripping process of the present invention results in the complete removal of a photoresist layer disposed on a polyimide layer without significant degradation of the polyimide features and without significant etching of the polyimide layer.

We claim:

1. In the fabrication of a semiconductor device on a substrate, said substrate having a polyimide layer formed thereon, said polyimide layer having a photoresist layer formed thereon, a process for complete removal of said photoresist layer without significant etching of said polyimide layer, said polyimide layer to remain on said substrate to form a part of said device, comprising the steps of:
   heating said substrate; and
   exposing said substrate to a plasma until an endpoint is reached.

2. The process as in claim 1 wherein said heating is performed by:
   applying heat to said substrate for a predetermined time immediately before said exposure to said plasma; and
   applying heat to said substrate during said exposure to said plasma.

3. The process as in claim 2 wherein said exposure to said plasma is carried out in a microwave downstream plasma etch system and said plasma comprises oxygen.

4. The process as described in claim 3 wherein said spectral emission is caused by a change in the energy state of methyl radicals.

5. The process as in claim 1 wherein said heating is performed by applying heat to said substrate for at least some time during said exposure to said plasma.

6. The process as described in claim 5 wherein said exposure to said plasma is carried out in a microwave downstream plasma etch system and said plasma comprises oxygen.

7. The process as described in claim 6 wherein said spectral emission is caused by a change in the energy state of methyl radicals.

8. The process as in claim 1 wherein said exposure to said plasma is carried out in a microwave downstream plasma etch system and said plasma comprises oxygen.

9. The process as described in claim 8 wherein said spectral emission is caused by a change in the energy state of methyl radicals.

10. The process as described in claim 1, 2, 3, 5, 6, or 8 wherein said process further comprises the step of exposing said photoresist to said plasma for a predetermined time after said endpoint is reached.

11. The process as described in claim 1, 2, 3, 5, 6, or 8 wherein said endpoint is detected by detecting a change in a spectral emission of said plasma.

12. The process as described in claim 1, 2, 3, 5, 6, or 8 wherein said heating is performed by infrared lamps.

* * * * *